(12) United States Patent
Shindo

(10) Patent No.: US 11,984,340 B2
(45) Date of Patent: May 14, 2024

(54) TEACHING METHOD

(71) Applicant: TOKYO ELECTRON LIMITED, Tokyo (JP)

(72) Inventor: Takehiro Shindo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 740 days.

(21) Appl. No.: 17/173,781

(22) Filed: Feb. 11, 2021

(65) Prior Publication Data
US 2021/0252695 A1 Aug. 19, 2021

(30) Foreign Application Priority Data

Feb. 13, 2020 (JP) .................................. 2020-022426

(51) Int. Cl.
| | |
|---|---|
| *H01L 21/68* | (2006.01) |
| *B25J 9/16* | (2006.01) |
| *B25J 11/00* | (2006.01) |
| *H01L 21/67* | (2006.01) |
| *H01L 21/677* | (2006.01) |

(52) U.S. Cl.
CPC .......... *H01L 21/681* (2013.01); *B25J 9/1697* (2013.01); *B25J 11/0095* (2013.01); *H01L 21/67259* (2013.01); *H01L 21/67751* (2013.01)

(58) Field of Classification Search
CPC ............. H01L 21/681; H01L 21/67259; H01L 21/67751; H01L 21/67748; H01L 21/67703; H01L 21/682; H01L 21/67742; B25J 9/1697; B25J 11/0095; B25J 9/0081; G05B 2219/36414; G05B 2219/45032; G05B 19/41815; G05B 19/42; Y02P 90/02; H01J 37/32642
See application file for complete search history.

(56) References Cited

U.S. PATENT DOCUMENTS

| | | | |
|---|---|---|---|
| 7,233,841 B2 | 6/2007 | Sadighi et al. | |
| 7,627,395 B2 | 12/2009 | Sadighi et al. | |
| 11,037,810 B2 | 6/2021 | Mochizuki | |
| 2003/0202092 A1* | 10/2003 | Sadighi | ................. B25J 9/1697 348/87 |

(Continued)

FOREIGN PATENT DOCUMENTS

| | | |
|---|---|---|
| CN | 1759478 A | 4/2006 |
| CN | 109994404 A | 7/2019 |

(Continued)

*Primary Examiner* — Thomas Randazzo
(74) *Attorney, Agent, or Firm* — Fenwick & West LLP

(57) ABSTRACT

A teaching method for a transfer mechanism is provided. The teaching method includes (a) placing a first substrate or an edge ring on a fork of the transfer mechanism, transferring the first substrate or the edge ring to a target position, and placing the first substrate or the edge ring onto the target position; (b) placing a second substrate having a position detection sensor on the fork, and transferring the second substrate to a position directly above or below the target position; (c) detecting an amount of deviation between the first substrate or the edge ring and the target position using the position detection sensor of the second substrate; and (d) correcting transfer position data of the transfer mechanism for the first substrate or the edge ring to be transferred next, based on the detected amount of deviation.

12 Claims, 6 Drawing Sheets

(56) References Cited

U.S. PATENT DOCUMENTS

| | | | |
|---|---|---|---|
| 2007/0112465 A1 | 5/2007 | Sadighi et al. | |
| 2007/0276533 A1* | 11/2007 | Machiyama | H01L 21/67259 |
| | | | 700/121 |
| 2010/0033706 A1* | 2/2010 | Shindo | H01L 21/67259 |
| | | | 355/74 |
| 2015/0219439 A1* | 8/2015 | Kondoh | H01L 21/67766 |
| | | | 356/614 |
| 2018/0033666 A1* | 2/2018 | Watanabe | H01L 21/67098 |
| 2019/0172742 A1* | 6/2019 | Mochizuki | H01L 21/681 |
| 2020/0094399 A1* | 3/2020 | Shindo | H01L 21/67196 |
| 2020/0126828 A1* | 4/2020 | Oka | H01L 21/68707 |

FOREIGN PATENT DOCUMENTS

| | | |
|---|---|---|
| JP | 2019-102728 A | 6/2019 |
| KR | 10-2005-0105517 A | 11/2005 |
| WO | WO 2004/082014 A1 | 9/2004 |

\* cited by examiner

TEACHING METHOD

CROSS-REFERENCE TO RELATED APPLICATION

This application claims priority to Japanese Patent Application No. 2020-022426, filed on Feb. 13, 2020, the entire contents of which are incorporated herein by reference.

TECHNICAL FIELD

The present disclosure relates to a teaching method.

BACKGROUND

In manufacturing semiconductor devices, a substrate processing system including a transfer mechanism for transferring a substrate between multiple modules is used. In the substrate processing system, the transfer mechanism loads the substrate into each module and delivers the substrate to lift pins protruding from a substrate support disposed in each module.

In such a substrate processing system, an operator teaches transfer information such as a substrate placing position in each module or the like to the transfer mechanism using an inspection substrate in order to accurately transfer the substrate into each module. Further, it is suggested to obtain an image of a substrate support with a camera provided at the inspection substrate and correct a position where the substrate is delivered to the substrate support by the transfer mechanism (see, e.g., Japanese Patent Application Publication No. 2019-102728).

SUMMARY

The present disclosure provides a teaching method capable of improving an accuracy of a transfer position.

In accordance with an aspect of the present disclosure, there is provided a teaching method for a transfer mechanism. The teaching method includes (a) placing a first substrate or an edge ring on a fork of the transfer mechanism, transferring the first substrate or the edge ring to a target position, and placing the first substrate or the edge ring onto the target position; (b) placing a second substrate having a position detection sensor on the fork, and transferring the second substrate to a position directly above or below the target position; (c) detecting an amount of deviation between the first substrate or the edge ring and the target position using the position detection sensor of the second substrate; and (d) correcting transfer position data of the transfer mechanism for the first substrate or the edge ring to be transferred next, based on the detected amount of deviation.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a teaching method will be described in detail with reference to the accompanying drawings. The following embodiments are not intended to limit the present disclosure.

Recently, a substrate processing system requires improvement of a transfer accuracy of a device in order to improve performance of processing. It is known that teaching of a transfer mechanism is performed to improve the transfer accuracy. However, when the teaching of the transfer mechanism is performed by a method in which the device is opened to the atmosphere and a reference substrate (hereinafter, also referred to as "wafer") is manually placed on a substrate support by an operator, downtime increase due to a gas supply/exhaust time and a cleaning time. On the other hand, as described above, it is suggested to transfer the inspection substrate provided with a sensor such as a camera or the like in the vacuum using the transfer mechanism without an operator and to correct the transfer position where the substrate is delivered to the substrate support by the transfer mechanism. Since, the inspection substrate is provided with a camera or the like, however, it is heavier than a product substrate, and the transfer position may be deviated due to gear backlash of the transfer mechanism or hysteresis caused by torsion of a shaft. The deviation of the transfer position is, e.g., about several tens of μm, but cannot be ignored recently in terms of the accuracy. Accordingly, it is expected to improve the accuracy of the transfer position.

(Configuration of Substrate Processing System 1)

Figure 1:
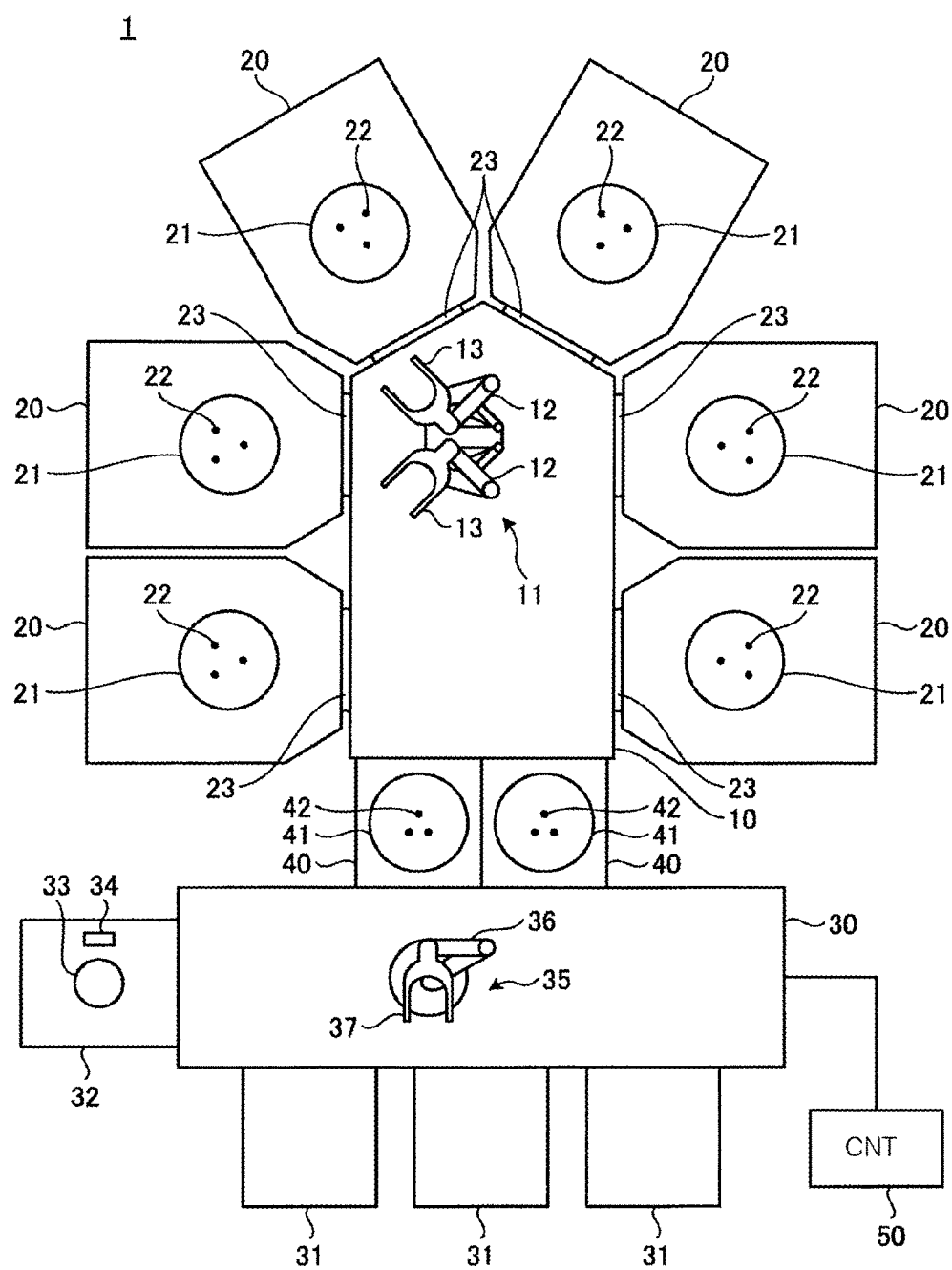
FIG. 1 is a horizontal cross-sectional plan view showing an example of a substrate processing system according to an embodiment.

FIG. 1 is a horizontal cross-sectional plan view showing an example of a substrate processing system according to an embodiment of the present disclosure. A substrate processing system 1 shown in FIG. 1 can perform various treatments such as plasma processing and the like on a wafer (e.g., a semiconductor wafer) one at a time.

As shown in FIG. 1, the substrate processing system 1 includes a transfer module 10, six process modules 20, a loader module 30, and two load-lock modules 40.

The transfer module 10 has a substantially pentagonal shape in plan view. The transfer module 10 has a vacuum chamber, and a transfer mechanism 11 is disposed therein. The transfer mechanism 11 includes a guide rail (not shown), two arms 12, and a fork 13 disposed at a tip end of each arm 12 to support the wafer. Each arm 12 is of a SCARA arm type, and is configured to be rotatable, extensible and contractible. The transfer mechanism 11 moves along the guide rail and transfers the wafer between the process modules 20 and the load-lock module 40. The transfer mechanism 11 does not necessarily have the configuration shown in FIG. 1 as long as the wafer can be transferred between the process modules 20 and the load-lock modules 40. For example, each arm 12 of the transfer mechanism 11 may be configured to be rotatable, extensible/contractible, and vertically movable.

The process modules 20 are radially arranged around the transfer module 10 and connected to the transfer module 10. Each process module 20 has a processing chamber and a cylindrical stage 21 (a substrate support) is disposed therein. The stage 21 is provided with three thin bar-shaped lift pins 22 that can protrude beyond and retract below an upper surface of the stage 21. The lift pins 22 are arranged on the same circumference in plan view. When the lift pins 22 protrude beyond the upper surface of the stage 21, the wafer placed on the stage 21 is lifted and supported by the lift pins 22. When the lift pins 22 retract below the upper surface the stage 21, the wafer is placed on the stage 21. After the wafer is placed on the stage 21, a pressure in the process module 20 is reduced and a processing gas is introduced into the process module 20. Plasma is generated by applying an RF power into the process module 20, and plasma processing is performed on the wafer by the generated plasma. The transfer module 10 and the process modules 20 are partitioned by openable/closable gate valves 23.

The loader module 30 is disposed to face the transfer module 10. The loader module 30 is a rectangular parallelepiped-shaped atmospheric transfer chamber maintained in an atmospheric pressure atmosphere. The two load-lock modules 40 are connected to one long side of the loader module 30. Three load ports 31 are connected to the other long side of the loader module 30. A front-opening unified pod (FOUP) (not shown) that is a container for accommodating a plurality of wafers is placed on each load port 31. An aligner 32 is connected to one short side of the loader module 30. A transfer mechanism 35 is disposed in the loader module 30.

The aligner 32 aligns the wafer. The aligner 32 has a rotating stage 33 rotated by a driving motor (not shown). The rotating stage 33 has a diameter smaller than, e.g., a diameter of the wafer, and is configured to be rotatable in a state where the wafer is placed on the upper surface thereof. An optical sensor 34 for detecting an outer peripheral edge of the wafer is disposed near the rotating stage 33. In the aligner 32, a central position of the wafer and a direction of a notch with respect to the central position of the wafer are detected by the optical sensor 34. The wafer is delivered to a fork 37 to be described later such that the central position of the wafer becomes a predetermined position and the direction of the notch becomes a predetermined direction. Accordingly, the transfer position of the wafer is adjusted such that the central position of the wafer becomes the predetermined position and the direction of the notch in the load-lock module 40 becomes the predetermined direction.

The transfer mechanism 35 includes a guide rail (not shown), an arm 36, and the fork 37. The arm 36 is of a SCARA arm type, and is configured to be movable along the guide rail and rotatable, extensible/contractible, and vertically movable. The fork 37 is disposed at the tip end of the arm 36 to support the wafer. In the loader module 30, the transfer mechanism 35 transfers the wafer between the FOUP placed on each load port 31, the aligner 32, and the load-lock modules 40. The transfer mechanism 35 does not necessarily have the configuration shown in FIG. 1 as long as the wafer can be transferred between the FOUP, the aligner 32, and the load-lock modules 40.

The load-lock modules 40 are disposed between the transfer module 10 and the loader module 30. Each load-lock module 40 has a chamber of which inner pressure can be switched between a vacuum state and an atmospheric pressure, and a cylindrical stage 41 is disposed therein. In the case of loading the wafer from the loader module 30 into the transfer module 10, the wafer is transferred from the loader module 30 into the load-lock module 40 maintained at an atmospheric pressure; the pressure in the load-lock module 40 is decreased; and the wafer is loaded into the transfer module 10. In the case of unloading the wafer from the transfer module 10 to the loader module 30, the wafer is transferred from the transfer module 10 into the load-lock module 40 maintained in a vacuum state; the pressure in the load-lock module 40 is increased to an atmospheric pressure; and the wafer is loaded into the loader module 30. The stage 41 is provided with three thin bar-shaped lift pins 42 that can protrude beyond and retract below the upper surface of the stage 41. The lift pins 42 are arranged on the same circumference in plan view. When the lift pins 42 protrude beyond the upper surface of the stage 41, the wafer is lifted and supported by the lift pins 42. When the lift pins 42 retract below the upper surface of the stage 41, the wafer is placed on the stage 41. The load-lock modules 40 and the transfer module 10 are partitioned by openable and closeable gate valves (not shown). Further, the load-lock modules 40 and the loader module 30 are partitioned by openable and closeable gate valves (not shown).

The substrate processing system 1 includes a controller (CNT) 50. The controller 50 is, e.g., a computer, and includes a central processing unit (CPU), a random access memory (RAM), a read only memory (ROM), an auxiliary storage device, and the like. The CPU operates based on a program stored in the ROM or the auxiliary storage device, and controls operations of the respective components of the substrate processing system 1.

(Inspection Wafer)

Figure 2:
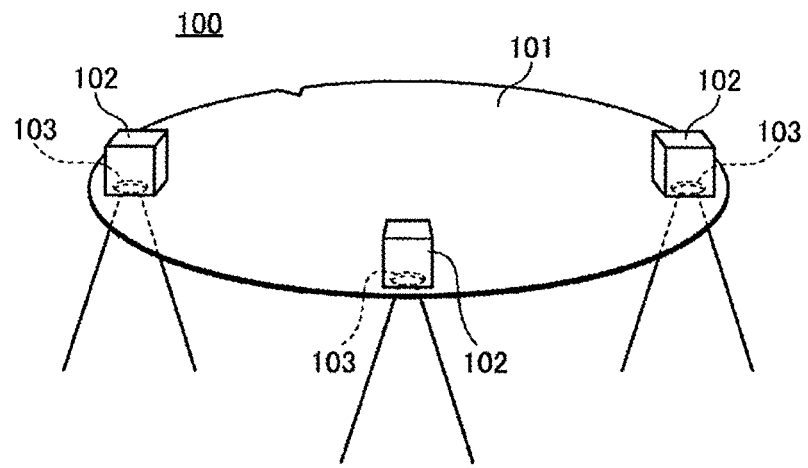
FIG. 2 shows an example of an inspection wafer in the embodiment.

FIG. 2 shows an example of an inspection wafer in the present embodiment. As shown in FIG. 2, the inspection wafer 100 includes a base wafer 101 and a plurality of (e.g., three) cameras 102. The base wafer 101 preferably has the same size as that of a product wafer. By using the base wafer 101 having the same size as that of the product wafer, the inspection wafer 100 can be transferred between the modules in the same manner as in the case of the product wafer. Specifically, in the case of using a product wafer having a diameter of, e.g., 300 mm, the base wafer 101 preferably has a diameter of 300 mm.

The cameras 102 are an example of a position detection sensor, and are arranged on the outer peripheral portion, for example, on the same circumference, of the surface of the base wafer 101. For example, it is preferable to provide the cameras 102 at three locations at an interval of 120° on the same circumference. Each camera 102 is configured to image a lower side of the base wafer 101 through an opening 103 formed in the base wafer 101. The number of the cameras 102 is not limited and may be one or more. For example, the cameras 102 may be disposed at two locations where two orthogonal lines passing through the center of the base wafer 101 and the circumference of the outer peripheral portion intersect. Further, the camera 102 may be disposed at one location of the outer peripheral portion of the base wafer 101, and the inspection wafer 100 may be moved to the aligner 32 and rotated. Further, the camera 102 has a communication function of transmitting the captured image to the controller 50. The communication function may be performed using, e.g., Bluetooth (Registered Trademark) or the like. Further, the inspection wafer 100 may have a storage unit for storing images obtained by the cameras 102.

(Teaching Method)

Figure 3:
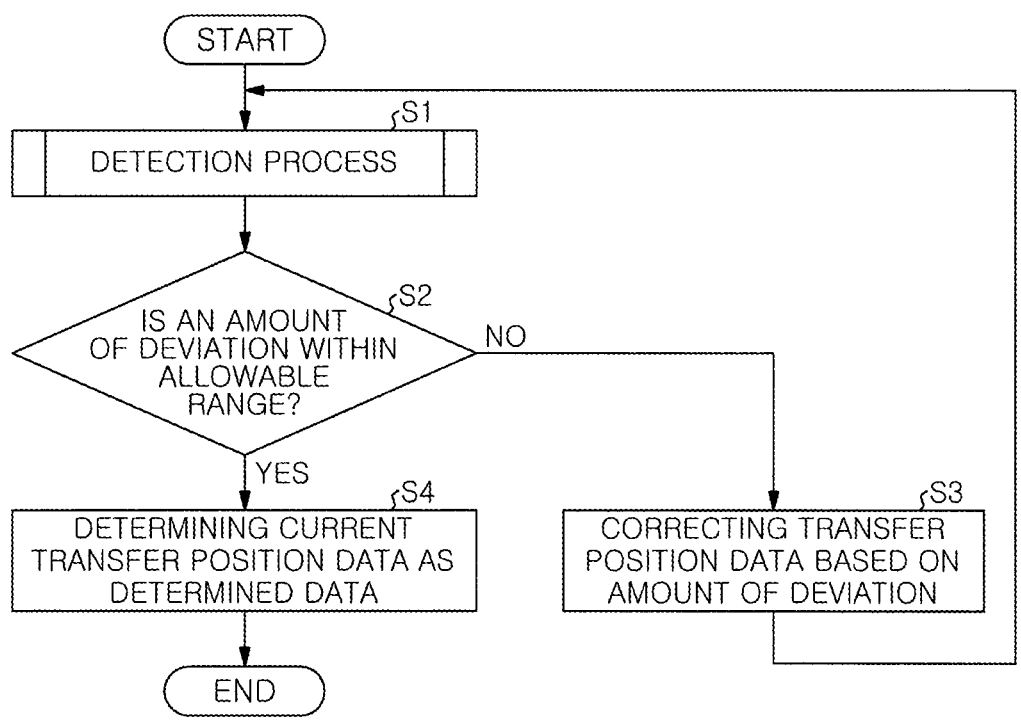
FIG. 3 is a flowchart showing an example of a teaching process in the embodiment.

Next, an operation of the substrate processing system 1 of the present embodiment will be described. FIG. 3 is a flowchart showing an example of a teaching process in the present embodiment. In the following description, the operations of the respective components of the substrate processing system 1 are controlled by the controller 50.

Figure 4:
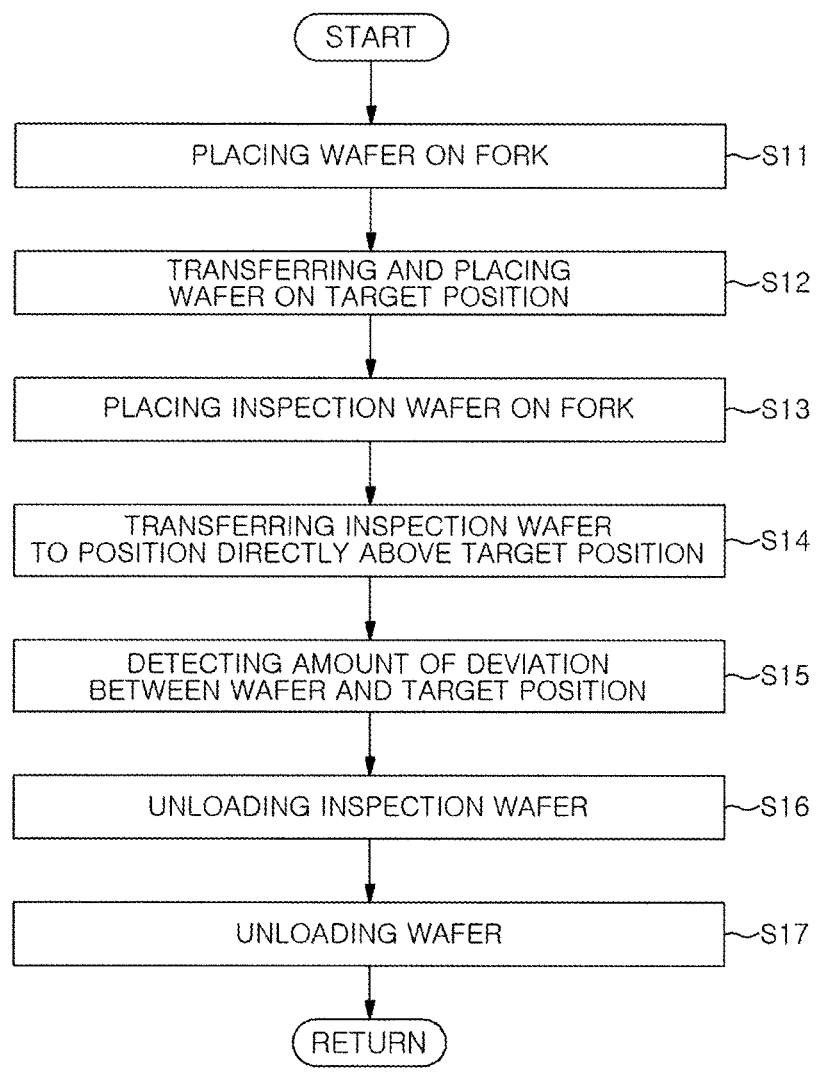
FIG. 4 is a flowchart showing an example of a detection process in the embodiment.

The controller 50 executes a detection process for detecting the amount of deviation between the product wafer W and a target position of the wafer W (step S1). Here, the detection process will be described with reference to FIG. 4. FIG. 4 is a flowchart showing an example of the detection process in the present embodiment.

First, an operation of placing the inspection wafer 100 or the wafer W accommodated in the FOUP of the load port 31 on the fork 13 of the transfer module 10 will be described using the wafer W as an example. In the following description, when the same operation of placing the wafer W or the inspection wafer 100 on the fork 13 is performed, the description of the operation will be omitted.

First, the FOUP accommodating therein the wafer W is placed on the load port 31. Next, the wafer W is position-aligned. In the case of position-aligning the wafer W, the fork 37 of the transfer mechanism 35 enters the FOUP, lifts and supports the wafer W, and retreats from the FOUP. Next, the controller 50 causes the fork 37 supporting the wafer W to enter the aligner 32 and to be lowered to place the wafer W on the rotating stage 33. Then, the controller 50 causes the fork 37 to retreat from the aligner 32, and the wafer W is position-aligned by the aligner 32. After the wafer W is position-aligned, the controller 50 causes the fork 37 to enter the aligner 32 and lift and support the wafer W. Then, the fork 37 retreats from the aligner 32. At this time, since the wafer W is position-aligned, the wafer W is delivered to the fork 37 such that the central position of the wafer W becomes the predetermined position and the direction of the notch becomes the predetermined direction. When the position-alignment of the wafer W has been performed in advance, the position alignment of the wafer W may be omitted.

Next, the controller 50 causes the fork 37 supporting the wafer W to enter the load-lock module 40 maintained at an atmospheric pressure and, then, the three lift pins 42 protrude beyond the upper surface of the stage 41 to lift and separate the wafer W from the fork 37. Next, the controller 50 causes the fork 37 to retreat from the load-lock module 40 and then to retract below the upper surface of the stage 41 to place the wafer W on the stage 41. At this time, since the wafer W is delivered to the fork 37 such that the central position of the wafer W becomes the predetermined position and the direction of the notch becomes the predetermined direction, the central position of the wafer W in the load-lock module 40 becomes the predetermined position and the direction of the notch becomes the predetermined direction.

After the pressure in the load-lock module 40 is decreased, the controller 50 causes the three lift pins 42 to protrude beyond the upper surface of the stage 41 to lift the wafer W. Next, the controller 50 causes the fork 13 of the transfer mechanism 11 to enter the load-lock module 40 and, then, the three lift pins 42 are lowered to allow the wafer W to be supported by the fork 13. In other words, the controller 50 places the wafer W on the fork 13 of the transfer mechanism 11 (step S11).

The controller 50 causes the fork 13 supporting the wafer W to enter the process module 20 and, then, the three lift pins 22 protrude beyond the upper surface of the stage 21 to lift and separate the wafer W from the fork 13. The controller 50 causes the fork 37 to retreat from the process module 20 and then to retract below the upper surface of the stage 21 to place the wafer W on the stage 21. In other words, the controller 50 causes the wafer W to be transferred to and placed on the target position on the stage 21 (step S12). The target position is a position on which the wafer W is to be placed on the stage 21, e.g., a position where the center of the stage 21 and the center of the wafer W coincide with each other.

Next, the controller 50 places the inspection wafer 100 accommodated in the FOUP of the load port 31 on the fork 13 of the transfer module 10 in the same manner as in the case of the wafer W (step S13).

The controller 50 causes the fork 13 supporting the inspection wafer 100 to enter the process module 20 and transfer the inspection wafer 100 to a position directly above the stage 21 on which the wafer W is placed, i.e., a position directly above the target position (step S14).

The controller 50 instructs the cameras 102 installed at the inspection wafer 100 to obtain images of an area including the peripheral portion of the wafer W and the peripheral portion of the stage 21 at the position directly above the target position. The cameras 102 transmit identification information (e.g., camera IDs) and the images to the controller 50. When the cameras 102 do not have a communication function, a communication device may be installed in addition to the cameras 102 at the inspection wafer 100 and the images obtained by the cameras 102 may be transmitted to the controller 50.

The controller 50 obtains the circumferential positions of the wafer W and the stage 21 by using a circular interpolation based on the arc of the peripheral portion of the stage 21 and the arc of the peripheral portion of the wafer W that are included in the images obtained by the cameras 102. In other words, the controller 50 obtains the central positions of the circumferences from the arcs. The controller 50 detects a relative deviation amount between the wafer W and the target position based on the difference between the circumferential position of the wafer W and the circumferential position of the stage 21 (step S15). For example, when the cameras 102 are arranged at three locations at an interval of 120°, if the difference between the circumferential position of the wafer W and the circumferential position of the stage 21 is the same in the cameras 102, the amount of deviation from the target position that is detected by the controller 50 is zero.

Figure 5:
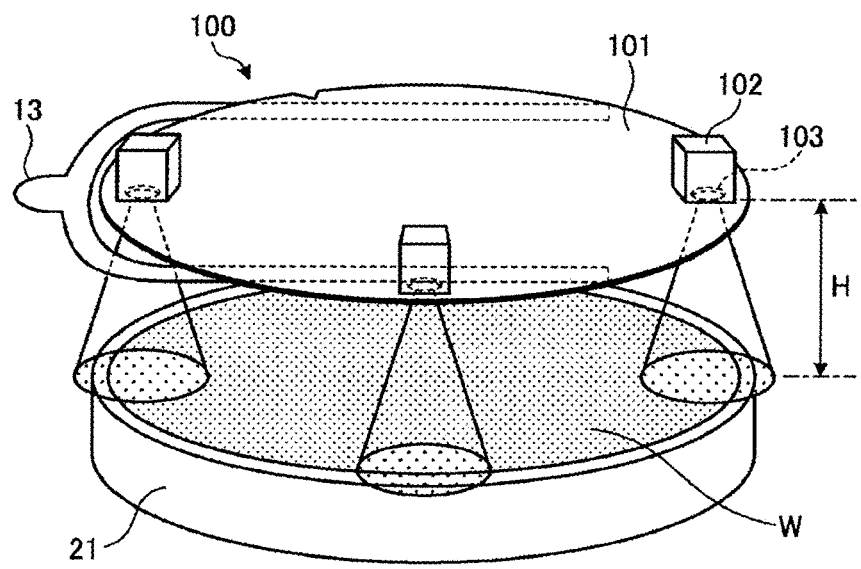
FIG. 5 shows an example of a state in which the inspection wafer is transferred to a position directly above a target position.
Figure 6:
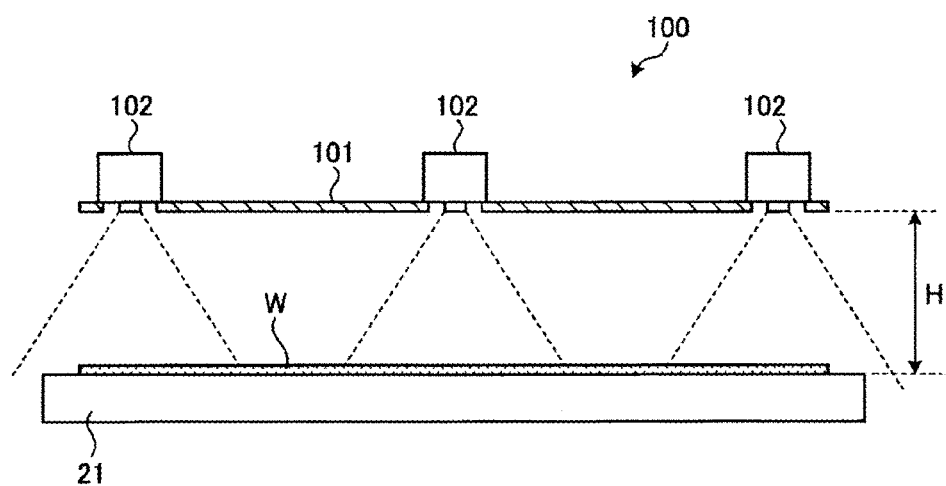
FIG. 6 is a side view of the state in which the inspection wafer is transferred to the position directly above the target position.

Here, a state in which the inspection wafer 100 is transferred to the position directly above the target position will be described with reference to FIGS. 5 and 6. FIG. 5 shows an example of the state in which the inspection wafer is transferred to the position directly above the target position. FIG. 6 is a side view of the state in which the inspection wafer is transferred to the position directly above the target position. In FIG. 6, the fork 13 is omitted.

As shown in FIGS. 5 and 6, a previously transferred wafer W is placed on the stage 21, and the inspection wafer 100 transferred by the fork 13 is positioned directly above the stage 21. The inspection wafer 100 is upwardly separated from the surface of the stage 21 on which the wafer W is placed by a predetermined distance H. As shown in FIG. 5, the cameras 102 disposed at the inspection wafer 100 obtain images of the peripheral portions (edges) of the stage 21 and the wafer W. If the reference such as scales or regularly spaced points is provided within a field of view of the cameras 102, the positional deviation in a height direction, i.e., the predetermined distance H, can also be corrected.

Referring back to FIG. 4, the controller 50 unloads the inspection wafer 100 from the process module 20 (step S16). In other words, the controller 50 moves the inspection wafer 100 into the FOUP of the load port 31. Here, the operation of moving the inspection wafer 100 from the position on the fork 13 into the FOUP of the load port 31 will be described. The operation of moving the wafer W from the position on the fork 13 into the FOUP of the load port 31 is the same as the operation of moving the inspection wafer W and, thus, the description thereof will be omitted. In the following description, the description of the operation of moving the wafer W or the inspection wafer 100 from the position on the fork 13 into the FOUP of the load port 31 will be omitted.

The controller 50 transfers the fork 13 supporting the inspection wafer 100 from the process module 20 into the load-lock module 40 maintained in a vacuum state. The controller 50 causes the three lift pins 42 to protrude beyond the upper surface of the stage 41 to lift and separate the inspection wafer 100 from the fork 13. The controller 50 causes the fork 13 to retreat from the load-lock module 40, and then causes the three lift pins 42 to retract below the stage 41 to place the inspection wafer 100 on the stage 41.

After a pressure in the load-lock module 40 is increased to an atmospheric pressure, the controller 50 causes the three lift pins 42 to protrude beyond the upper surface of the stage 41 to lift the inspection wafer 100. Then, the controller 50 causes the fork 37 of the transfer mechanism 35 to enter the load-lock module 40. Then, the controller 50 lowers the three lift pins 42 to allow the inspection wafer 100 to be supported by the fork 37. Then, the controller 50 causes the fork 37 supporting the inspection wafer 100 to enter the FOUP, and the inspection wafer 100 is accommodated in the FOUP placed on the load port 31.

When the inspection wafer 100 is moved into the FOUP of the load port 31, the controller 50 unloads the wafer W from the process module 20 (step S17). The controller 50 causes the three lift pins 22 of the process module 20 to protrude beyond the upper surface of the stage 21 to lift the wafer W. The controller 50 causes the fork 13 of the transfer mechanism 11 to enter the process module 20, and lowers the three lift pins 22 to allow the wafer W to be supported by the fork 13. Then, the controller 50 moves the wafer W into the FOUP of the load port 31 in the same manner as the case of the inspection wafer 100, ends the detection process, and returns to the original processing. Since the purpose of the detection process can be achieved as long as the amount of deviation between the wafer W and the target position in step S15 can be detected, the step of moving the inspection wafer 100 or the wafer W to the FOUP is not necessary.

Referring back to FIG. 3, the controller 50 determines whether or not the detected amount of deviation between the wafer W and the target position is within an allowable range (step S2). When the controller 50 determines that the amount of deviation between the wafer W and the target position is not within the allowable range (step S2: No), the transfer position data of the transfer mechanism 11 for a next wafer W to be transferred is corrected based on the amount of deviation (step S3), and the processing returns to step S1. In other words, the controller 50 repeats the detection process of step S1 until the amount of deviation is within the allowable range.

On the other hand, when it is determined that the amount of deviation between the wafer W and the target position is within the allowable range (step S2: Yes), the controller 50 determines the current transfer position data as determined data (step S4), and ends the teaching process. Accordingly, the substrate processing system 1 can perform the teaching of the transfer position of the wafer W and improve the accuracy of the transfer position.

In the substrate processing system 1, the product wafer W is transferred to the target position, so that there is no deviation in the stop position of the transfer mechanism 11 between the teaching and the processing. Further, in the substrate processing system 1, the teaching is performed while considering the deviation at the time of delivering the wafer from the fork 13 to the lift pins 22 or the stage 21, so that the accuracy of the transfer position can be improved. Further, in the substrate processing system 1, it is not necessary to open the process module 20 to the atmosphere and, thus, downtime can be considerably reduced. The teaching process performed in the substrate processing system 1 can be applied to a conventional device as long as it is a device that can transfer the inspection wafer 100. Further, in the substrate processing system 1, the teaching can be automated, so that the accuracy of the transfer position can be stable without depending on an operator.

Figure 7:
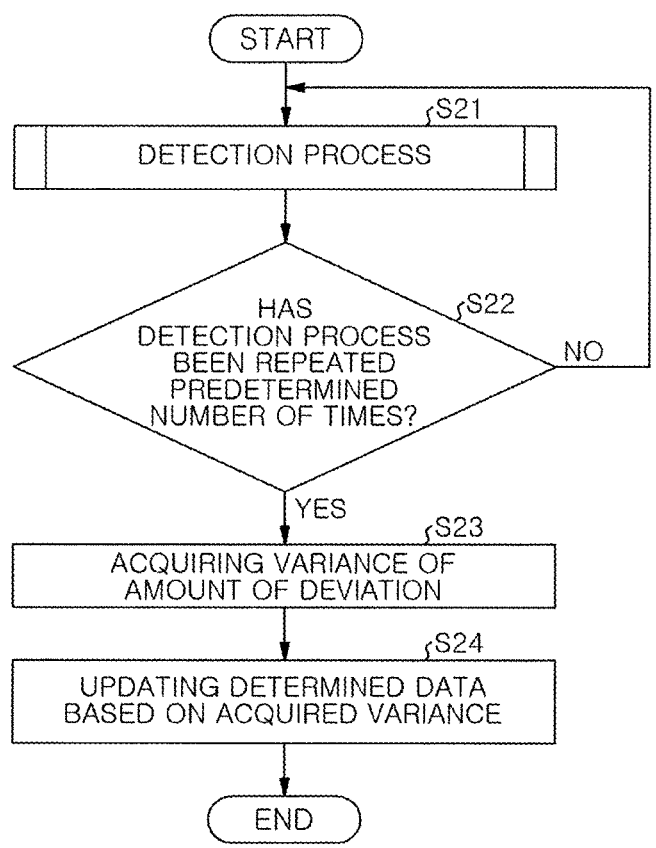
FIG. 7 is a flowchart showing an example of an updating process in the embodiment.

Next, an updating process for improving the accuracy of the determined data obtained in the teaching process will be described. FIG. 7 is a flowchart showing an example of the updating process in the present embodiment.

The controller 50 performs the detection process in the same manner as in the case of the teaching process (step S21). Since the details of the detection process are the same as those of the detection process of step S1 in the teaching process, the description thereof will be omitted. The controller 50 determines whether or not the detection process has been repeated a predetermined number of times (step S22). Here, the predetermined number of times may be, e.g., about 10 to 100 times. When it is determined that the process has not been repeated a predetermined number of times (step S22: No), the controller 50 returns to step S21 and continues to perform the detection process.

On the other hand, when it is determined that the process has been repeated a predetermined number of times (step S22: Yes), the controller 50 calculates and acquires a variance of the amount of deviation based on the amount of deviation of the predetermined number of times (step S23). The controller 50 updates the determined data based on the acquired variance (step S24) and ends the updating process. The controller 50 updates the determined data such that an expected value of the variance becomes the center of the allowable range of the amount of deviation, for example. Accordingly, the substrate processing system 1 can teach the transfer position of the wafer W while considering the variation in the transfer operations of the transfer mechanism 11 or the variation in the transfer operations of the transfer mechanism 35. Moreover, the accuracy of the transfer position can be further improved.

(Modification 1)

In the above-described embodiment, the teaching is performed using the product wafer W. However, a teaching wafer may be used. For example, the stage of the process module may have a hole at the center thereof. In this case, the teaching wafer having a hole at the center thereof may be used, and the amount of deviation between the wafer W and the target position can be detected by detecting the amount of deviation between the holes.

Figure 8:
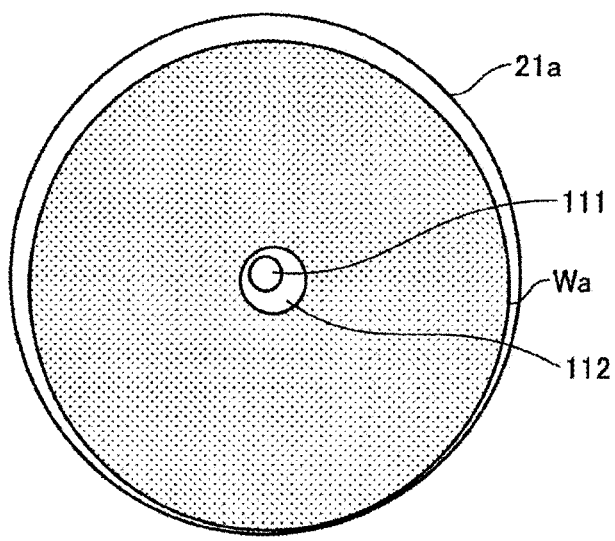
FIG. 8 shows an example of a wafer and a stage in a first modification.

FIG. 8 shows an example of the wafer and the stage in the modification 1. FIG. 8 is a top view of the stage on which the wafer is placed. A stage 21a shown in FIG. 8 has a hole 111 at the center thereof. A wafer Wa that is a teaching wafer has a hole 112 at the center thereof. In the case of using the stage 21a and the wafer Wa, one camera 102 may be disposed at the center of the inspection wafer 100 to obtain images of the holes 111 and 112. The controller 50 can detect the amount of deviation between the wafer Wa and the target position by calculating the central positions of the stage 21a and the wafer Wa from the holes 111 and 112. Even when the camera 102 is disposed at the peripheral portion of the inspection wafer 100, the images of the holes 111 and 112 may be obtained by extending and contracting the arm 12 of the transfer mechanism 11. In other words, if the hole 112 is set to a first mark and the hole 111 is set to a second mark, the controller 50 can detect the amount of deviation between the wafer Wn and the target position based on the first mark of the wafer Wa and the second mark of the stage 21a.

It is also possible to detect the amount of deviation between the wafer W and the target position when the first mark of the wafer W is a notch for position alignment and the second mark of the stage 21 is a bank (not shown) that defines the placing position of the wafer W. In the case of using the notch, the deviation of the notch position in a θ direction (rotational direction) as well as the deviation in a horizontal direction can be corrected. The deviation in the θ direction can be corrected by teaching the approach angle of the fork 13 of the transfer mechanism 11 or θ in the aligner 32. When a specific pattern on the wafer W is located at a specific position on the stage 21, the specific pattern may be used as the first mark. Further, the teaching wafer may have a positioning mark serving as the first mark at a certain position thereof (Modification 2)

Figure 9:
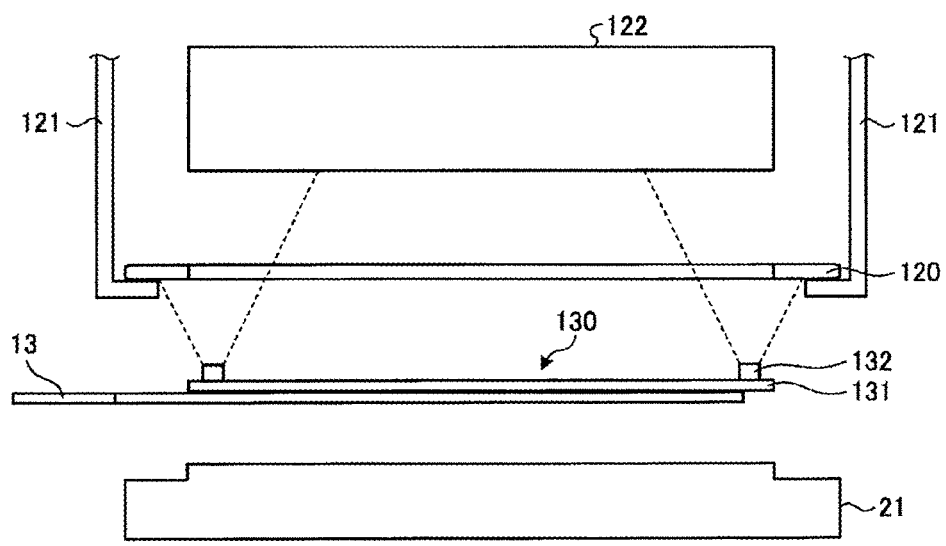
FIG. 9 shows an example of a state in which the inspection wafer is transferred to a position directly below the target position in a second modification.

In the above-described embodiment, the teaching of the transfer position of the product wafer W was performed. However, it is also possible to perform the teaching of the transfer position of parts such as an edge ring and the like that can be transferred by the transfer mechanism and need to be replaced. FIG. 9 shows an example of a state in which the inspection wafer is transferred to a position directly below the target position in a modification 2. FIG. 9 shows a state in which an edge ring 120 transferred into the process module 20 is lifted toward a shower head 122 by a lift mechanism 121 and the fork 13 on which an inspection wafer 130 is placed is transferred into the process module 20. In this case, the edge ring 120 is lifted vertically upward from the stage 21 by the lift mechanism 121. In other words, the edge ring 120 is placed on the lift mechanism 121, and the position of the edge ring 12 lifted toward the shower head 122 in this state is set to a target position of the edge ring 120. In other words, the target position may be, e.g., a position where the central position of the edge ring 120 coincides with the central position of the shower head 122.

The inspection wafer 130 is provided with a plurality of cameras 132 disposed on the base wafer 131 to face the shower head 122. The cameras 132 obtain images of an arc on an inner peripheral portion of the edge ring 120 and an arc on a peripheral portion of the shower head 122. In other words, the inspection wafer 130 is transferred to a position directly below the target position of the edge ring 120, and the controller 50 detects the amount of deviation between the edge ring 120 and the shower head 122. The controller 50 can correct the transfer position data of the edge ring 120 based on the detected amount of deviation between the edge ring 120 and the target position. Accordingly, even when the edge ring 120 is replaced, the accuracy of the transfer position of the wafer W can be improved by performing the teaching of both the edge ring 120 and the wafer W. In other words, the wafer W can be placed at the central position of the edge ring 120 after the replacement.

In the above-described embodiments, the camera is used as the position detection sensor. However, the present disclosure is not limited thereto. For example, the amount of deviation may be detected by detecting end portions of the wafer W and the stage 21 using a capacitive sensor, a laser displacement meter, or the like.

Further, in the above-described embodiments, the teaching method is applied to the case of correcting the positional deviation of the transfer mechanism 11 with respect to the stage 21 in the process module 20. However, the present disclosure is not limited thereto. For example, the teaching method according to the embodiment of the present disclosure may also be applied to the case of correcting the positional deviation of the transfer mechanism 35 with respect to the stage 41 of the load-lock module 40.

As described above, in accordance with the present embodiment, the teaching method for the transfer mechanism 11 that is performed by the controller 50 of the substrate processing system 1 includes (a) placing, (b) transferring, (c) detecting, and (d) correcting. The controller 50 performs: (a) placing the first substrate (wafer W) or the edge ring 120 on the fork 13 of the transfer mechanism 11, transferring the first substrate or the edge ring 120 to the target position, and placing the first substrate or the edge ring 12 onto the target position; (b) placing the second substrate having the position detection sensor on the fork, and transferring the substrate to a position directly above or directly below the target position; (c) detecting an amount of deviation between the first substrate or the edge ring and the target position, by using the position detection sensor of the second substrate; and (d) correcting the transfer position data of the transfer mechanism for the first substrate or the edge ring to be transferred next, based on the detected amount of deviation. Accordingly, the teaching of the transfer position of the first substrate (wafer W) or the edge ring 120 can be performed, and the accuracy of the transfer position can be improved.

Further, in accordance with the present embodiment, the controller 50 performs (e) repeating (a) to (d) until the amount of deviation is within the allowable range. Therefore, the teaching of the transfer position of the first substrate or the edge ring 120 can be performed, and the accuracy of the transfer position can be improved.

Further, in accordance with the present embodiment, the controller 50 performs: (f) determining the transfer position data, that is obtained when the amount of deviation is within the allowable range, as determined data; (g) repeating (a) to (c) based on the determined data and acquiring a variance of the amount of deviation; and (h) updating the determined data based on the acquired variance. Therefore, the teaching of the transfer position of the first substrate can be performed while considering the variation in the transfer operations of the transfer mechanism 11.

Further, in accordance with the present embodiment, in the c), the amount of deviation is detected between a peripheral portion of the first substrate or the edge ring 120 and a peripheral portion of a shower that faces the substrate support (stage 21) for placing the first substrate or the edge ring 120. Therefore, the teaching of the transfer position of the first substrate or the edge ring 120 can be performed, and the accuracy of the transfer position can be improved.

Further, in accordance with the present embodiment, the first substrate has a first mark, and in the (c), the amount of deviation is detected based on the first mark of the first substrate and the second mark of the substrate support on which the first substrate is placed. Therefore, the amount of deviation between the first substrate and the substrate support can be easily detected.

Further, in accordance with the present embodiment, the first mark is a hole formed at the center of the first substrate, and the second mark is a hole formed at the center of the substrate support. Therefore, the amount of deviation between the first substrate and the substrate support can be easily detected.

Further, in accordance with the present embodiment, the first mark is a positioning notch formed at a peripheral portion of the first substrate, and the second mark is a bank for defining a placing position of the first substrate that is formed at the peripheral portion of the substrate support. Therefore, the amount of deviation between the first substrate and the substrate support can be easily detected even by a conventional device.

Further, in accordance with the present embodiment, the position detection sensor is a camera, and in the (c), the amount of deviation is detected based on the image obtained by the camera. Therefore, the amount of deviation can be detected even if the number of cameras is two or less.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

Further, in the above embodiment, the case where the substrate is a semiconductor wafer has been described as an example. However, the present disclosure is not limited thereto, and the substrate may be, e.g., a glass substrate, an LCD substrate, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A teaching method for a transfer mechanism comprising:
   (a) placing a first substrate or an edge ring on a fork of the transfer mechanism, transferring the first substrate or the edge ring to a target position, and placing the first substrate or the edge ring onto the target position;
   (b) placing a second substrate having a position detection sensor on the fork, and transferring the second substrate to a position directly above or below the target position;
   (c) detecting an amount of deviation between the first substrate or the edge ring and the target position, by using the position detection sensor of the second substrate; and
   (d) correcting transfer position data of the transfer mechanism for the first substrate or the edge ring to be transferred next, based on the detected amount of deviation.

2. The teaching method of claim 1, further comprising:
   (e) repeating (a) to (d) until the amount of deviation is within an allowable range.

3. The teaching method of claim 1, further comprising:
   (f) determining the transfer position data, that is obtained when the amount of deviation is within an allowable range, as determined data,
   (g) repeating (a) to (c) based on the determined data, and acquiring a variance of the amount of deviation; and
   (h) updating the determined data based on the acquired variance.

4. The teaching method of claim 2, further comprising:
   (f) determining the transfer position data, that is obtained when the amount of deviation is within the allowable range, as determined data,
   (g) repeating (a) to (c) based on the determined data, and acquiring a variance of the amount of deviation; and
   (h) updating the determined data based on the acquired variance.

5. The teaching method of claim 1, wherein in said (c), the amount of deviation is detected between a peripheral portion of the first substrate or the edge ring and a peripheral portion of a shower head that faces a substrate support on which the first substrate is placed or the edge ring.

6. The teaching method of claim 2, wherein in said (c), the amount of deviation is detected between a peripheral portion of the first substrate or the edge ring and a peripheral portion of a shower head that faces a substrate support on which the first substrate is placed or the edge ring.

7. The teaching method of claim 1, wherein the first substrate has a first mark, and
   in said (c), the amount of deviation is detected based on the first mark of the first substrate and a second mark of the substrate support on which the first substrate is placed.

8. The teaching method of claim 2, wherein the first substrate has a first mark, and
   in said (c), the amount of deviation is detected based on the first mark of the first substrate and a second mark of the substrate support on which the first substrate is placed.

9. The teaching method of claim 7, wherein the first mark is a hole formed at a center of the first substrate, and the second mark is a hole formed at a center of the substrate support.

10. The teaching method of claim 7, wherein the first mark is a positioning notch formed at a peripheral portion of the first substrate, and the second mark is a bank for defining a placing position of the first substrate that is formed at a peripheral portion of the substrate support.

11. The teaching method of claim 1, wherein the position detection sensor is a camera, and
    in said (c), the amount of deviation is detected based on an image captured by the camera.

12. The teaching method of claim 2, wherein the position detection sensor is a camera, and
    in said (c), the amount of deviation is detected based on an image captured by the camera.

* * * * *